(12) United States Patent
Chu et al.

(10) Patent No.: US 8,618,564 B2
(45) Date of Patent: Dec. 31, 2013

(54) HIGH EFFICIENCY LIGHT EMITTING DIODES

(75) Inventors: Jung-Tang Chu, Zhunan Township, Miaoli County (TW); Hsing-Kuo Hsia, Jhubei (TW); Ching-Hua Chiu, Hsinchu (TW)

(73) Assignee: TSMC Solid State Lighting Ltd., Hsinchu (TW)

(*) Notice: Subject to any disclaimer, the term of this patent is extended or adjusted under 35 U.S.C. 154(b) by 495 days.

(21) Appl. No.: 12/898,500

(22) Filed: Oct. 5, 2010

(65) Prior Publication Data

US 2012/0080698 A1  Apr. 5, 2012

(51) Int. Cl.
*H01L 33/20* (2010.01)
*H01L 33/46* (2010.01)

(52) U.S. Cl.
USPC ........ 257/98; 257/94; 257/103; 257/E33.023; 257/E33.025; 257/E33.069

(58) Field of Classification Search
USPC ............... 257/94, 98, 103, E33.025, E33.072
See application file for complete search history.

(56) References Cited

U.S. PATENT DOCUMENTS

2009/0272993 A1* 11/2009 Cheong ............................ 257/94
2009/0278165 A1* 11/2009 Chang et al. ................... 257/103

OTHER PUBLICATIONS

Wang, Jing, et al., "Fabrication of Patterned Sapphire Substrate by Wet Chemical Etching for Maskless Lateral Overrowth of GaN," Journal of the Electrochemical Society, 153 (3), 2006, pp. C182-C185.

* cited by examiner

*Primary Examiner* — Matthew W Such
*Assistant Examiner* — David Spalla
(74) *Attorney, Agent, or Firm* — Haynes and Boone, LLP

(57) ABSTRACT

The present disclosure relates to high efficiency light emitting diode devices and methods for fabricating the same. In accordance with one or more embodiments, a light emitting diode device includes a substrate having one or more recessed features formed on a surface thereof and one or more omni-directional reflectors formed to overlie the one or more recessed features. A light emitting diode layer is formed on the surface of the substrate to overlie the omni-directional reflector. The one or more omni-directional reflectors are adapted to efficiently reflect light.

20 Claims, 6 Drawing Sheets

HIGH EFFICIENCY LIGHT EMITTING DIODES

BACKGROUND

Light emitting diodes (LEDs) emit light when voltages are applied across a P/N junction. Conventional fabrication of LEDs include growing and patterning epitaxial layers of semiconductor materials on a wafer having a growth substrate.

In the past, growing LED structures on a patterned surface may have improved LED luminescence efficiency. However, photon extraction efficiency was still deficient because generated photons were transmitted into the substrate, trapped by the substrate material, and then absorbed by the substrate material itself.

Therefore, there exists a need for an LED and method of fabricating the same that improves luminescence efficiency without degenerating transmitted photons so as to produce a stronger emission intensity.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion. It should be appreciated that like reference numerals are used to identify like elements illustrated in one or more of the figures.

DETAILED DESCRIPTION

Figure 1A:
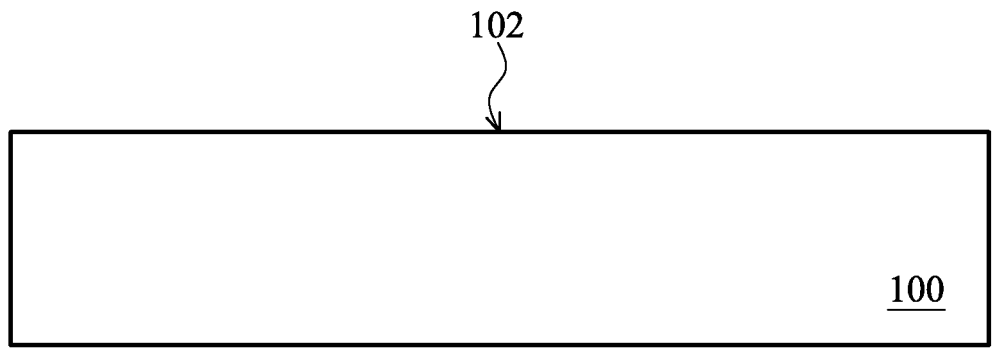
FIGS. 1A-1D show a process for forming a high efficiency light emitting diode (LED), in accordance with an embodiment of the present disclosure.

It is understood that the present disclosure provides many different forms and embodiments, and that specific embodiments are provided only as examples. Further, the scope of the present disclosure will only be defined by the appended claims. In the drawings, the sizes and relative sizes of layers and regions may be exaggerated for clarity. It will be understood that when an element or layer is referred to as being "on," or "coupled to" another element or layer, it may be directly on, or coupled to the other element or layer, or intervening elements or layers may be present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Hereinafter, embodiments of the present invention will be explained in detail with reference to the accompanying drawings.

FIGS. 1A-1D show a process for forming a high efficiency light emitting diode (LED), in accordance with an embodiment of the present disclosure.

FIG. 1A shows one embodiment of a substrate 100 having a first surface 102. In various implementations, substrate 100 may comprise a sapphire substrate, silicon (Si) substrate, silicon-carbide (SiC) substrate, gallium-nitride (GaN) substrate, or various composite substrates.

Figure 1B:
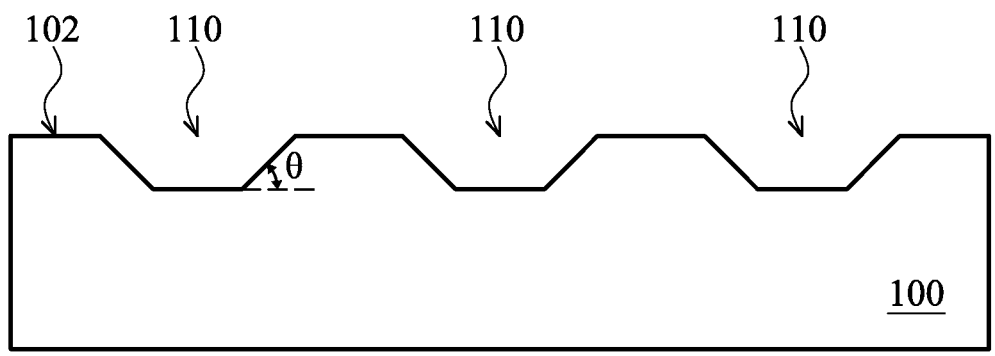

FIG. 1B shows one embodiment of patterning the first surface 102 of substrate 100 with recessed features 110. In one implementation, one or more recessed features 110 may be defined on the first surface 102 of substrate 100 by utilizing etching techniques, such as a wet etching technique and/or a dry etching technique including an inducted coupled plasma (ICP) dry etching technique. In one aspect, each recessed feature 110 may be etched as a recess in the first surface 102 of substrate 100 to include sidewalls with an inclined angle (A), which may be controlled by modifying the etching technique to form the inclined angle (A) with a 45° to 90° angle and a depth from 100 nm (nanometer) to 2.5 um (micrometer).

Figure 1C:
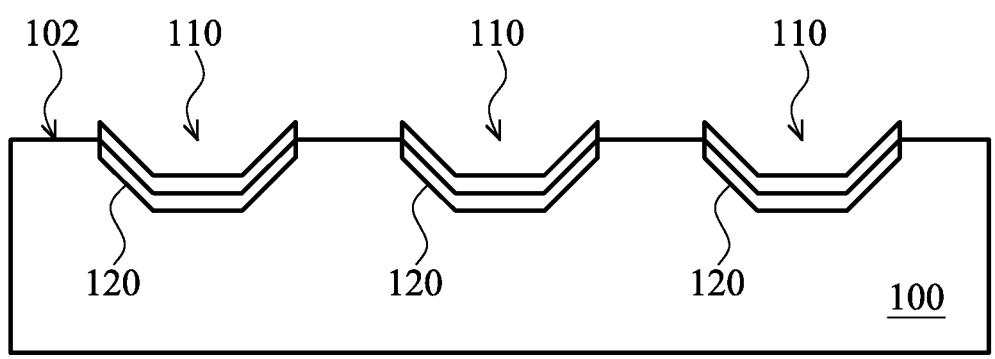

FIG. 1C shows one embodiment of forming omni-directional reflectors 120 on one or more surfaces of each recessed feature 110. In one implementation, un-etched portions of the first surface 102 of substrate 100 are protected during deposition of each omni-directional reflector 120, which are deposited on sidewall surfaces and lower surface of each recessed feature 110, as shown for example in FIG. 1C. The omni-directional reflectors 120 may be deposited with thermal evaporator or heat gun evaporator techniques.

In one embodiment, each omni-directional reflector 120 may comprise a layered structure having multiple layers to reflect a target emission wavelength. For example, in various implementations, the layered structure may comprise a combination of one or more dielectric material layers including a titanium-oxide ($TiO_2$) layer, a silicon-oxide ($SiO_2$) layer, a tantalum-oxide ($Ta_2O_5$) layer, and the thickness of each dielectric material layer may be related to the target emission wavelength for the LED device. In other implementations, some other materials that may be utilized for dielectric material layers of omni-directional reflector 120. For example, the omni-directional reflector 120 may include one or more layers of titanium-oxide ($TiO_2$), hafnium-oxide ($HfO_2$), niobium-oxide ($Nb_2O_5$), cerium-oxide ($CeO_2$), zirconium-oxide ($ZrO_2$), calcium-fluoride ($CaF_2$), and silicon-nitride ($Si_3N_4$). In one aspect, pairs of multiple dielectric layers may be deposited in an alternating manner to increase reflectivity of the layered structure.

In one embodiment, the pattern arrangement of the recessed features 110 on the first surface 102 of substrate 100 and the sidewall inclined angle (A) of the recessed features 110 may be controlled by the utilized etching technique, and therefore, the recessed features 110 may be tuned to modify the LED device emission shape. For example, ICP power flow rate may be utilized to control the inclined angle (A) of the recessed feature sidewalls.

In accordance with embodiments of the present disclosure, omni-directional reflectors 120 formed of multiple combinations of different materials (e.g., $SiO_x$, $Ta_2O_5$, $TiO_2$) may reflect at least more than 80% light and, in some instances, reflect at least more than 95% light with arbitrary incident angle. In various aspects, the shape of etched recessed feature may be modified to provide a far-field emission pattern.

Figure 1D:
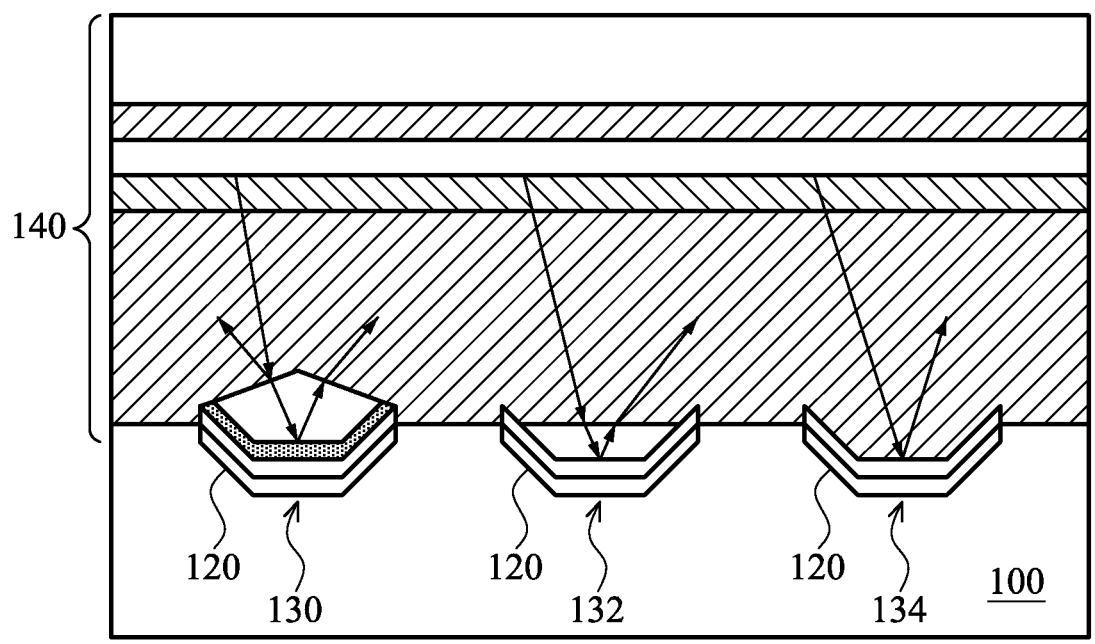

FIG. 1D shows one embodiment of forming an LED structure 140 on the patterned substrate 100. In one implementation, after deposition of each omni-directional reflector 120, protective material is removed, and the LED structure 140 is formed on the patterned substrate 100, for example, as shown in FIG. 1D.

In one embodiment, the LED structure 140 may comprise a layered structure having multiple epitaxial layers formed of GaN material. The epitaxial layers may be formed by deposition processes, such as metal organic chemical vapor deposition (MOCVD), physical vapor deposition (PVD), atomic level deposition (ALD), or other deposition processes. The epitaxial layers may include an n-doped GaN layer (n-GaN) or other n-type semiconductor material layer, a multiple quantum well (MQW) active layer having alternating (or periodic) layers of GaN and indium-gallium-nitride (InGaN), a p-doped GaN layer (p-GaN) or other p-type semiconductor material layer, and a p-contact metal layer. LED structures may have different configurations and different processing steps based on how the n-doped layer is electrically accessed. In face-up GaN LEDs where contact metallization for the p-GaN layer and the n-GaN layer are both on the top side of the LEDs, portions of the p-GaN layer and the MQW active layer may be etched to expose the n-GaN layer for forming an n-contact metallization layer.

In one aspect, when depositing the epitaxial layers, the growth substrate acts as a seed crystal, and n-doped GaN layer, MQW active layer, and p-doped GaN layer may take on a lattice structure and an orientation that are substantially similar to the growth substrate. After completion of epitaxial growth, a P/N junction (or a P/N diode) may be formed when the MQW active layer is disposed between n-doped GaN layer and p-doped GaN layer. When electrical voltage (or electrical charge) is applied to n-doped GaN layer and p-doped GaN layer, electrical current flows through the LED, causing the MQW active layer to emit light. The color of the light emitted by the MQW active layer is associated with the wavelength of the light, which may be tuned by varying the composition and structure of the materials that form the MQW active layer.

In one aspect, referring to FIG. 1D, by considering the lateral growth condition of the LED structure 140, three conditions 130, 132, 134 may be observed. For example, a first condition 130 may refer to a coalesce boundary that may be higher than the GaN/substrate interface. In another example, a second condition 132 may refer to a coalesce boundary that may be at nearly the same height as the GaN/substrate interface. In another example, a third condition 134 may refer to a coalesce boundary that may be lower than the GaN/substrate interface. These conditions 130, 132, 134 may exist air void between the GaN material and the omni-directional reflectors 120. Since the critical angle between GaN and air may be small, such as about 24°, a large amount of photons may be reflected at the interface, and transmitted light may be reflected by each deposited omni-directional reflector 120.

In accordance with embodiments of the present disclosure, the deposited omni-directional reflectors 120 on sidewalls of the recessed features 110 may inhibit GaN growth on etched surfaces and may significantly influence lateral coalescence at the interface between substrate 100 and GaN material of LED structure 140, which may advantageously lead to a better crystal quality at the interface. In one aspect, the patterned substrate may provide an increase in light extraction and/or reflectivity. In another aspect, the patterned substrate may improve crystal quality, lateral growth, and coalescence.

Conventional methods of growing LED structures on patterned surfaces may have been proven workable to improve LED luminescence efficiency. However, even though epitaxial layers were grown on patterned substrates, extraction efficiency was still not good enough because generated photons may be transmitted into the substrate, trapped by the material, and finally absorbed by the material itself.

Thus, embodiments of the present disclosure are adapted to extract more photons out of the device and reflect to topside, which contributes to a stronger emission intensity. As such, more extracted photons may result in less photon absorption by the material itself and an expectation of less waste heat generated.

In one embodiment, omni-directional reflectors 120 are patterned by depositing multiple layers of dielectric material on the patterned structure so as to efficiently reflect a significant amount of downward photons to topside thereby improving emission efficiency of the device. Since GaN material is not likely to grow on dielectric film, deposited dielectric layers may significantly suppress sidewall GaN growth and turn out a material with lateral growth. By well controlling the patterned structure, control of the light emission far-field pattern may be achieved.

As such, in accordance with embodiments of the present disclosure, the deposited omni-directional reflector 120 on sidewall inhibits GaN growth on etched surfaces and lateral coalescence, which may lead to a better crystal quality. Also, the omni-directional reflectors formed from combinations of different dielectric layers may reflect a significant amount of light (e.g., at least 80% to more than 95%) with arbitrary incident angle.

FIGS. 2A-2E show another process for forming a high efficiency light emitting diode (LED), in accordance with an embodiment of the present disclosure.

Figure 2A:
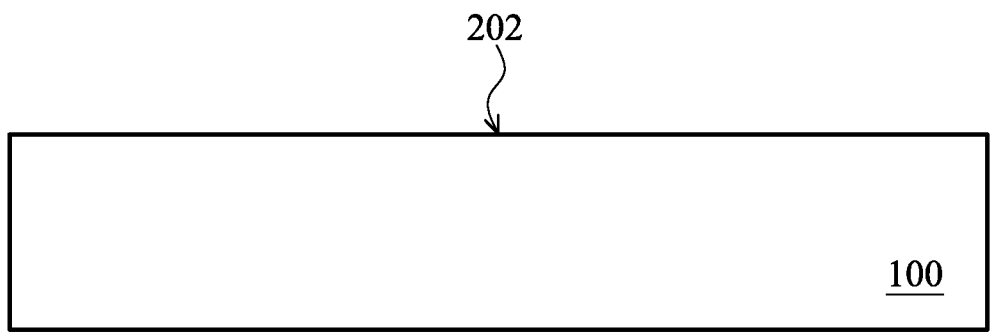
FIGS. 2A-2E show another process for forming a high efficiency light emitting diode (LED), in accordance with an embodiment of the present disclosure.

FIG. 2A shows one embodiment of substrate 100 having first surface 102, which is a flat surface. In various implementations, for example, as described in reference to FIG. 1A, substrate 100 may comprise a sapphire substrate, silicon (Si) substrate, silicon-carbide (SiC) substrate, gallium-nitride (GaN) substrate, or various composite substrates.

Figure 2B:
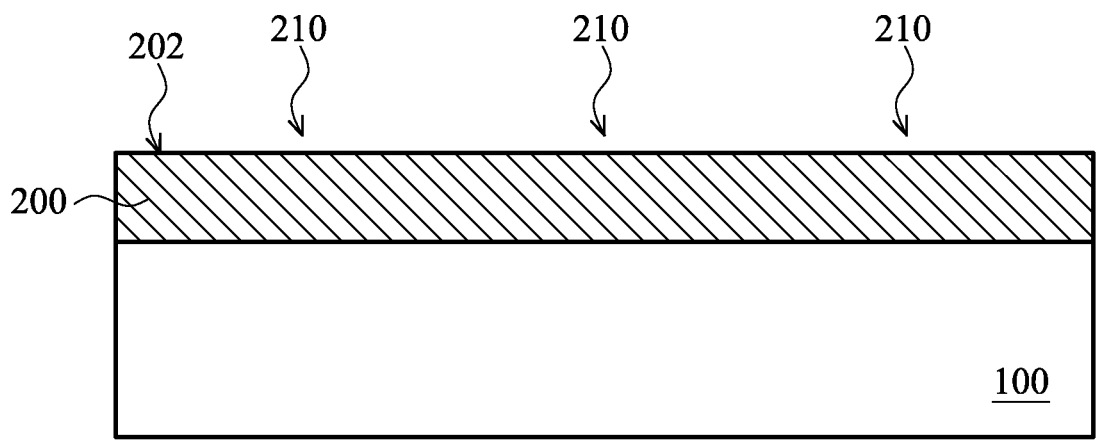

FIG. 2B shows one embodiment of forming an interlayer 200 on the first surface 102 of substrate 100, wherein interlayer 200 has a first surface 202. In various implementations, interlayer 200 may comprise a non-gallium-nitride (non-GaN) material, such as for example a silicon (Si) material, silicon-carbide (SiC) material, or various composite materials. In one aspect, the thickness of the interlayer 200 may be from approximately 100 nm (nanometer) to approximately 2.5 um (micrometer). In another aspect, the thickness of the interlayer 200 may be greater than 100 nm or greater than 2.5 um.

Figure 2C:
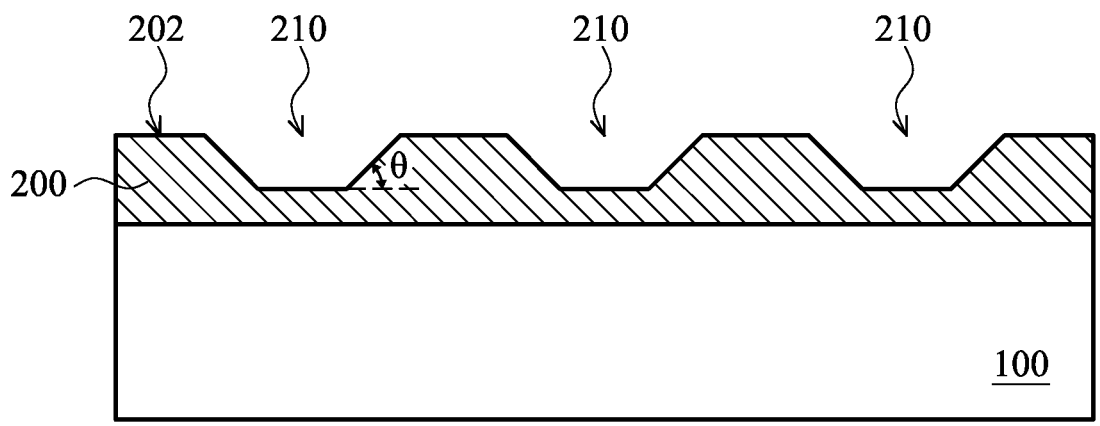

FIG. 2C shows one embodiment of patterning the first surface 202 of interlayer 200 with recessed features 210. In one implementation, one or more recessed features 210 may be defined on the first surface 202 of interlayer 200 by utilizing etching techniques, such as a wet etching technique or a dry etching technique including an ICP dry etching technique. In one aspect, each recessed feature 210 may be etched as a recess in the first surface 202 of interlayer 200 to include sidewalls with an inclined angle (θ), which may be controlled by modifying the etching technique to form the inclined angle (θ) with a 45° to 90° angle and a depth from 100 nm (nanometer) to 2.5 um (micrometer). In another aspect, it should be appreciated by those skilled in the art that the geometry of the recessed features 210 may be controlled from the etching condition, and the depth of the recessed features 210 may or may not exceed the thickness of the interlayer 200.

Figure 2D:
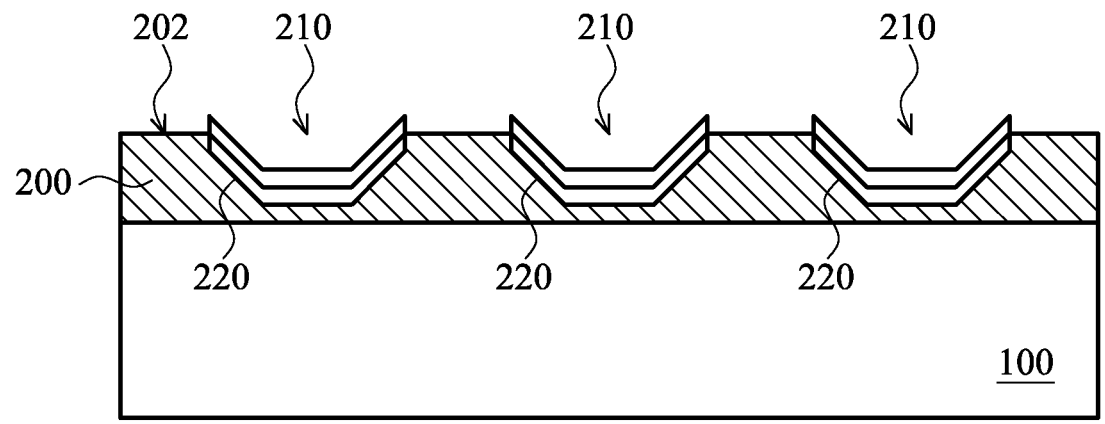

FIG. 2D shows one embodiment of forming omni-directional reflectors 220 on one or more surfaces of each recessed feature 210. In one implementation, un-etched portions of the first surface 202 of interlayer 200 are protected during deposition of each omni-directional reflector 220, which are deposited on sidewall surfaces and lower surface of each recessed feature 210, as shown for example in FIG. 2D.

In one embodiment, each omni-directional reflector 220 may comprise a layered structure having multiple layers to reflect a target emission wavelength. For example, in various implementations, the layered structure may comprise a combination of one or more dielectric material layers including layers of $TiO_2$, $SiO_2$, $Ta_2O_5$, and the thickness of each layer may be related to the target emission wavelength from the LED device. In various implementations, some other materials that may be utilized for dielectric material layers of omni-directional reflector 220 may include one or more layers of $HfO_2$, $Nb_2O_5$, $CeO_2$, $ZrO_2$, $CaF_2$, and $Si_3N_4$. In various aspects, pairs of multiple dielectric layers may be deposited in an alternating manner to increase reflectivity of the layered structure.

In one embodiment, the pattern arrangement of the recessed features 210 on the first surface 102 of substrate 100 and the sidewall inclined angle ($\theta$) of the recessed features 210 may be controlled by the utilized etching technique, and therefore, the recessed features 210 may be tuned to modify the LED device emission shape. For example, ICP power flow rate may be utilized to control the inclined angle ($\theta$) of the recessed feature sidewalls.

In accordance with embodiments of the present disclosure, omni-directional reflectors 220 formed of multiple combinations of different materials (e.g., $SiO_x$, $Ta_2O_5$, $TiO_2$) may reflect at least more than 80% light and, in some instances, reflect at least more than 95% light with arbitrary incident angle. In various aspects, the shape of etched recessed feature may be modified to provide a far-field emission pattern.

Figure 2E:
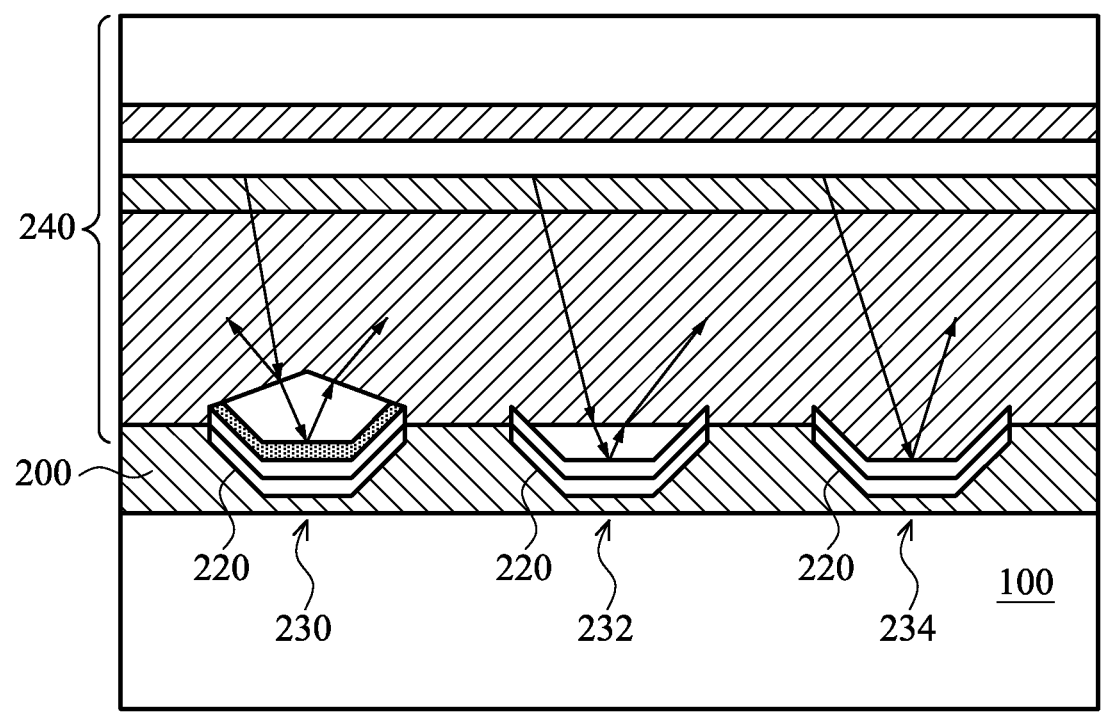

FIG. 2E shows one embodiment of forming an LED structure 240 on the patterned interlayer 200. In one implementation, after deposition of each omni-directional reflector 220, protective material is removed, and the LED structure 240 is formed on the patterned interlayer 200, as shown in FIG. 2E.

In one embodiment, the LED structure 240 may comprise a layered structure having multiple epitaxial layers formed of GaN material. The epitaxial layers may be formed by deposition processes, such as metal organic chemical vapor deposition (MOCVD), physical vapor deposition (PVD), atomic level deposition (ALD), or other deposition processes. The epitaxial layers may include an n-doped GaN layer (n-GaN) or other n-type semiconductor material layer, a multiple quantum well (MQW) active layer having alternating (or periodic) layers of GaN and indium-gallium-nitride (InGaN), a p-doped GaN layer (p-GaN) or other p-type semiconductor material layer, and a p-contact metal layer. LED structures may have different configurations and different processing steps based on how the n-doped layer is electrically accessed. In face-up GaN LEDs where contact metallization for the p-GaN layer and the n-GaN layer are both on the top side of the LEDs, portions of the p-GaN layer and the MQW active layer may be etched to expose the n-GaN layer for forming an n-contact metallization layer.

In one aspect, referring to FIG. 2E, by considering the lateral growth condition of the LED structure 240, three conditions 230, 232, 234 may be observed. For example, a first condition 230 may refer to a coalesce boundary that may be higher than the GaN/substrate interface. In another example, a second condition 232 may refer to a coalesce boundary that may be at nearly the same height as the GaN/substrate interface. In another example, a third condition 234 may refer to a coalesce boundary that may be lower than the GaN/substrate interface. These conditions 230, 232, 234 may exist air void between the GaN material and the omni-directional reflectors 220. Since the critical angle between GaN and air may be small, such as about 24°, a large amount of photons may be reflected at the interface, and transmitted light may be reflected by each deposited omni-directional reflector 220.

In accordance with embodiments of the present disclosure, the deposited omni-directional reflectors 220 on sidewalls of the recessed features 210 may inhibit GaN growth on etched surfaces and may significantly influence lateral coalescence at the interface between substrate 100 and GaN material of LED structure 240, which may advantageously lead to a better crystal quality.

Conventional methods of growing LED structures on patterned surfaces may have been proven workable to improve LED luminescence efficiency. However, even though epitaxial layers were grown on patterned substrates, extraction efficiency was still not good enough because generated photons may be transmitted into the substrate, trapped by the material, and finally absorbed by the material itself.

Thus, embodiments of the present disclosure are adapted to extract more photons out of the device and reflect to topside, which contributes to a stronger emission intensity. As such, more extracted photons may result in less photon absorption by the material itself and an expectation of less waste heat generated.

In one embodiment, omni-directional reflectors 220 are patterned by depositing multiple layers of dielectric material on the patterned structure so as to efficiently reflect a significant amount of downward photons to topside thereby improving emission efficiency of the device. Since GaN material is not likely to grow on dielectric film, deposited dielectric layers may significantly suppress sidewall GaN growth and turn out a material with lateral growth. By well controlling the patterned structure, control of the light emission far-field pattern may be achieved.

As such, in accordance with embodiments of the present disclosure, the deposited omni-directional reflector 220 on sidewall inhibits GaN growth on etched surfaces and lateral coalescence, which may lead to a better crystal quality. Also, the omni-directional reflectors formed from combinations of different dielectric layers may reflect a significant amount of light (e.g., at least 80% to more than 95%) with arbitrary incident angle.

Figure 3:
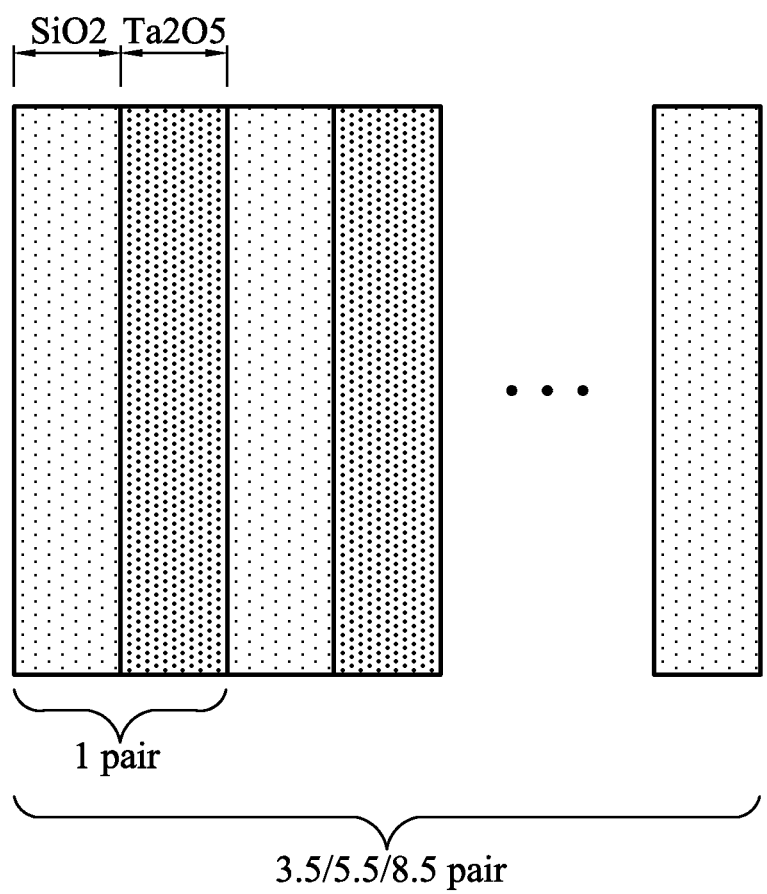
FIG. 3 shows alternating layers of different materials for omni-directional reflectors, in accordance with an embodiment of the present disclosure.
Figure 4:
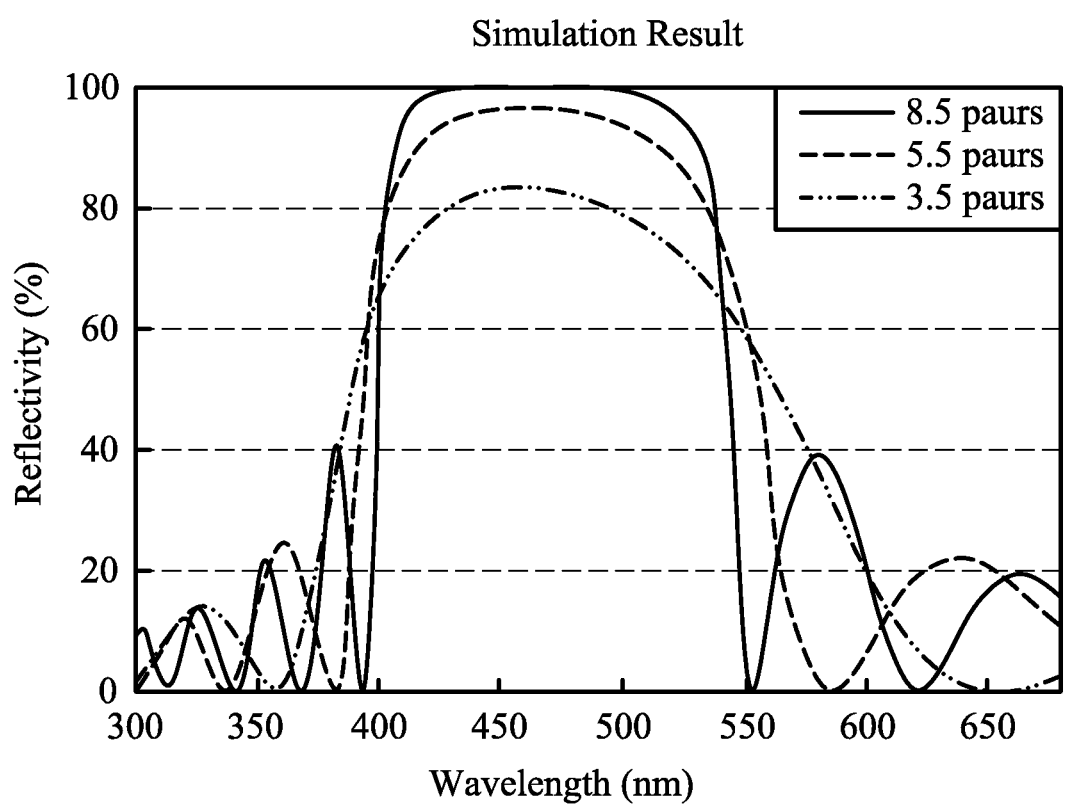
FIG. 4 shows a sample simulation result for reflectivity of omni-directional reflectors for a target wavelength, in accordance with an embodiment of the present disclosure.

FIG. 3 shows alternating layers of different materials for omni-directional reflectors, in accordance with an embodiment of the present disclosure. FIG. 4 shows a sample simulation result for reflectivity of omni-directional reflectors for a target wavelength, in accordance with an embodiment of the present disclosure.

In various embodiments, omni-directional reflectors 120, 220 may comprise a multi-layered structure having different material layers with different thicknesses to reflect a target emission wavelength. For example, in one embodiment, the multi-layered structure of the omni-directional reflectors 120, 220 may comprise a combination of one or more different material layers including silicon-oxide ($SiO_2$) and a tantalum-oxide ($Ta_2O_5$), wherein the thickness of each material layer may be related to the target emission wavelength for the LED device. In various examples, the thickness of the $SiO_2$ layer may range between 58 nm and 98 nm (e.g., approximately 78.7 nm), and the thickness of the Ta$_2$O$_5$ layer may range between 32 nm and 72 nm (e.g., approximately 52.2 nm).

Referring to FIG. 3, the SiO$_2$ layer and the Ta$_2$O$_5$ layer may be paired and repeated in an alternating pattern. In one implementation, a pair of SiO$_2$ and Ta$_2$O$_5$ layers may be repeated as 3.5, 5.5, or 8.5 pairs to reflect a target emission wavelength of blue light having a wavelength, for example, of approximately 460 nm. In other implementations, a pair of SiO$_2$ and Ta$_2$O$_5$ layers may be repeated as 3.5, 5.5, or 8.5 pairs to reflect a range of target emission wavelengths of light having wavelengths, for example, between 300 nm and 650 nm depending on desired functional parameters. In various aspects, pairs of multiple layers may be deposited in an alternating manner to increase reflectivity of the layered structure.

In one embodiment, referring to FIG. 4, omni-directional reflectors 120, 220 having 3.5 pairs of alternating paired layers of SiO$_2$ and Ta$_2$O$_5$ may have reflectivity of more than 80% for target wavelengths between 400 nm and 550 nm, including a wavelength of about 460 nm. In another embodiment, omni-directional reflectors 120, 220 having 5.5 pairs of alternating paired layers of SiO$_2$ and Ta$_2$O$_5$ may have reflectivity of more than 95% for target wavelengths between 400 nm and 550 nm, including a wavelength of about 460 nm. In still another embodiment, omni-directional reflectors 120, 220 having 8.5 pairs of alternating paired layers of SiO$_2$ and Ta$_2$O$_5$ may have reflectivity of up to 100% for target wavelengths between 400 nm and 550 nm, including a wavelength of about 460 nm. In various aspects, referring to FIG. 4, target wavelengths may include one or more wavelengths in a range of approximately 300 nm to approximately 650 nm without departing from the scope of the present disclosure including embodiments disclosed herein.

In various embodiments, some other materials that may be utilized for layers of omni-directional reflectors 120, 220 may include one or more of titanium-oxide (TiO$_2$), hafnium-oxide (HfO$_2$), niobium-oxide (Nb$_2$O$_5$), cerium-oxide (CeO$_2$), zirconium-oxide (ZrO$_2$), calcium-fluoride (CaF$_2$), and silicon-nitride (Si$_3$N$_4$). In one aspect, multiple materials may be selected with a wide difference of reflectivity so as to increase the overall reflectivity of the omni-directional reflectors.

The following table provides examples of disclosed materials with respective reflectivity at approximately 460 nm.

| Material | Refractive index (@ approx. 460 nm) |
| --- | --- |
| Ta2O5 | 2.2 |
| SiO2 | 1.46 |
| TiO2 | 2.48 |
| HfO2 | 1.95 |
| Nb2O5 | 2.4 |
| CeO2 | 2.36 |
| ZrO2 | 2.19 |
| CaF2 | 1.43 |
| Si3N4 | 2.06 |

In one embodiment, provided is a light emitting diode (LED) device comprising a substrate having a recessed feature formed on a first surface and an omni-directional reflector formed to overlie the recessed feature. The omni-directional reflector is adapted to efficiently reflect light. The LED device comprises a light emitting diode layer formed on the first surface of the substrate to overlie the omni-directional reflector.

In various implementations, the substrate may comprise at least one of sapphire, silicon (Si), silicon-carbide (SiC), and a gallium-nitride (GaN). The recessed feature may be etched as a recess in the first surface of the substrate to include a sidewall portion with an inclined angle and a lower portion with a first depth. The omni-directional reflector may be formed on the sidewall portion and the lower portion of the recessed feature. The inclined angle of the sidewall portion may be at least 45° or greater and at least 90° or less. The lower portion may be etched to a depth of at least 100 nm or greater and at least 2.5 um or less.

In various implementations, the omni-directional reflector may comprise a plurality of material layers combined to have a reflectivity of at least 80% or greater of a particular emission wavelength. The omni-directional reflector may comprise a plurality of material layers combined to efficiently reflect light of a particular emission wavelength including at least one wavelength between 400 nm and 550 nm. The omni-directional reflector may comprise a plurality of dielectric material layers including one or more of silicon-oxide (SiO2), tantalum-oxide (Ta2O5), titanium-oxide (TiO2), hafnium-oxide (HfO2), niobium-oxide (Nb2O5), cerium-oxide (CeO2), zirconium-oxide (ZrO2), calcium-fluoride (CaF2), and silicon-nitride (Si3N4).

In various implementations, the light emitting diode layer may comprise at least one gallium-nitride (GaN) layer in contact with the first surface of the substrate. The light emitting diode layer may comprise one or more epitaxial layers including at least one of an n-doped layer, a quantum well active layer, and a p-doped layer.

In various implementations, the LED device may include an interlayer formed on the first surface of the substrate, wherein the omni-directional reflector is formed on a first surface of the interlayer, and the interlayer comprises a non-galllium-nitride (GaN) material including at least one of silicon (Si) and silicon-carbide (SiC).

In another embodiment, provided is a LED device comprising a substrate having a plurality of recessed features formed on a first surface and a plurality of omni-directional reflectors formed to overlie corresponding recessed features. The omni-directional reflectors are adapted to efficiently reflect light. The LED device comprises a light emitting diode layer formed on the first surface of the substrate to overlie the omni-directional reflectors.

In still another embodiment, provided is a method of fabricating a light emitting diode comprising forming one or more recessed features on a first surface of a substrate and forming one or more omni-directional reflectors to overlie corresponding recessed features. The omni-directional reflectors are adapted to efficiently reflect light. The method comprises forming a light emitting diode layer formed on the first surface of the substrate to overlie the omni-directional reflectors.

Although embodiments of the present disclosure have been described, these embodiments illustrate but do not limit the disclosure. It should also be understood that embodiments of the present disclosure should not be limited to these embodiments but that numerous modifications and variations may be made by one of ordinary skill in the art in accordance with the principles of the present disclosure and be included within the spirit and scope of the present disclosure as hereinafter claimed.

What is claimed is:

1. A light emitting diode device comprising:
   a substrate having a surface;
   an interlayer formed on the surface of the substrate, the interlayer comprising a non-gallium-nitride (GaN) material including at least one of silicon (Si) or silicon-carbide (SiC);

a recessed feature disposed in the interlayer;
an omni-directional reflector disposed at least partially within the recessed feature, the omni-directional reflector adapted to efficiently reflect light; and
a light emitting diode layer disposed over the surface of the substrate, including over the omni-directional reflector.

2. The device of claim 1, wherein the substrate comprises at least one of a sapphire substrate, silicon (Si) substrate, silicon-carbide (SiC) substrate, and a gallium-nitride (GaN) substrate.

3. The device of claim 1, wherein:
the recessed feature includes a bottom portion and sidewall portions that extend at an inclined angle from the bottom portion to the surface of the interlayer, the bottom portion being disposed at a depth in the interlayer; and
the omni-directional reflector is disposed on the sidewall portions and the bottom portion of the recessed feature.

4. The device of claim 3, wherein:
the inclined angle of the sidewall portions is about 45° to about 90°, and
the depth of the bottom portion is about 100 nm to about 2.5 μM.

5. The device of claim 1, wherein the omni-directional reflector comprises a plurality of material layers combined to have a reflectivity of 80% or greater of a particular emission wavelength.

6. The device of claim 1, wherein the omni-directional reflector comprises a plurality of material layers combined to efficiently reflect light of a particular emission wavelength including at least one wavelength between 400 nm and 550 nm.

7. The device of claim 1, wherein:
the omni-directional reflector comprises a plurality of material layers, and
each material layer comprises a dielectric material including at least one of silicon-oxide ($SiO_2$), tantalum-oxide ($Ta_2O_5$), titanium-oxide ($TiO_2$), hafnium-oxide ($HfO_2$), niobium-oxide ($Nb_2O_5$), cerium-oxide ($CeO_2$), zirconium-oxide ($ZrO_2$), calcium-fluoride ($CaF_2$), and silicon-nitride ($Si_3N_4$).

8. The device of claim 1, wherein the light emitting diode layer comprises at least one gallium-nitride (GaN) layer in contact with the surface of the substrate interlayer.

9. The device of claim 1, wherein the light emitting diode layer comprises one or more epitaxial layers including at least one of an n-doped layer, a quantum well active layer, and a p-doped layer.

10. A light emitting diode device comprising:
a substrate having a surface;
an interlayer formed on the surface of the substrate, the interlayer comprising a non-gallium-nitride (GaN) material including at least one of silicon (Si) or silicon-carbide (SiC);
a plurality of recessed features formed in the interlayer;
a plurality of omni-directional reflectors disposed on sidewalls and bottom surfaces of corresponding recessed features, the omni-directional reflectors adapted to efficiently reflect light; and
a light emitting diode layer disposed over the surface of the substrate, including over the omni-directional reflectors,
wherein each recessed feature includes a bottom portion and sidewall portions that extend at an inclined angle from the bottom portion to the surface of the substrate, the bottom portion being disposed at a depth in the substrate, and
wherein each omni-directional reflector is disposed on the sidewall portions and the bottom portion of corresponding recessed features.

11. The device of claim 10, wherein the predetermined emission wavelength includes at least one wavelength between 400 nm and 550 nm.

12. The device of claim 10, wherein:
the bottom portion of each recessed feature has a flat surface;
the inclined angle of the sidewall portions of each recessed feature is about 45° to about 90°, and
the depth of the bottom portion is about 100 nm to about 2.5 μm.

13. The device of claim 10, wherein:
each omni-directional reflector comprises a plurality of alternatingly repeated material layers, and
each material layer comprises a dielectric material including at least one of silicon-oxide ($SiO_2$), tantalum-oxide ($Ta_2O_5$), titanium-oxide ($TiO_2$), hafnium-oxide ($HfO_2$), niobium-oxide ($Nb_2O_5$), cerium-oxide ($CeO_2$), zirconium-oxide ($ZrO_2$), calcium-fluoride ($CaF_2$), and silicon-nitride ($Si_3N_4$).

14. The device of claim 10, wherein the light emitting diode layer comprises:
at least one gallium-nitride (GaN) layer in contact with the surface of the interlayer, and
a plurality of epitaxial layers including an n-doped layer, a quantum well active layer, and a p-doped layer; and
wherein the plurality of omni-directional reflectors correspond to different lateral growth conditions.

15. A method of fabricating a light emitting diode comprising:
providing a substrate having a surface;
an interlayer formed on the surface of the substrate, the interlayer comprising a non-gallium-nitride (GaN) material including at least one of silicon (Si) or silicon-carbide (SiC);
forming a recessed feature within the interlayer, the recessed feature being defined by a bottom portion and sidewall portions that extend at an inclined angle from the bottom portion to the surface of the substrate, and the bottom portion being disposed at a depth in the substrate;
forming a omni-directional reflector over the recessed feature, the omni-directional reflector adapted to efficiently reflect light; and
forming a light emitting diode layer on the surface of the substrate and over the omni-directional reflectors.

16. The method of claim 15, wherein:
the substrate comprises at least one of a sapphire substrate, silicon (Si) substrate, silicon-carbide (SiC) substrate, and a gallium-nitride (GaN) substrate,
the forming the recessed feature includes etching a recess that extends into the substrate from the surface of the substrate, and
the omni-directional reflector being formed on the sidewall portions and the bottom portion of the recessed feature.

17. The method of claim 16, wherein:
the inclined angle of the sidewall portions is about 45° to about 90°, and
the bottom portion of the recessed feature is etched to the depth of about 100 nm to about 2.5 μm.

18. The method of claim 15, wherein:
the forming the omni-directional reflector comprises forming a plurality of material layers combined to have a reflectivity of 80% or greater of a particular emission wavelength, and each material layer comprises a dielectric material including at least one of silicon-oxide ($SiO_2$), tantalum-oxide ($Ta_2O_5$), titanium-oxide ($TiO_2$), hafnium-oxide ($HfO_2$), niobium-oxide ($Nb_2O_5$), cerium-oxide ($CeO_2$), zirconium-oxide ($ZrO_2$), calcium-fluoride ($CaF_2$), and silicon-nitride ($Si_3N_4$).

19. The method of claim 15, wherein the forming the light emitting diode layer comprises:
   forming at least one gallium-nitride (GaN) layer in contact with the surface of the interlayer, and
   forming a plurality of epitaxial layers including an n-doped layer, a quantum well active layer, and a p-doped layer.

20. The method of claim 15, wherein the forming the recessed feature is performed such that the bottom portion of the recessed feature includes a flat surface.

* * * * *